United States Patent
Fujii et al.

(10) Patent No.: US 10,976,582 B2
(45) Date of Patent: *Apr. 13, 2021

(54) DISPLAY

(71) Applicant: Sony Corporation, Tokyo (JP)

(72) Inventors: Hiroaki Fujii, Kanagawa (JP); Satoshi Mukoyama, Tokyo (JP); Soya Araki, Kanagawa (JP); Hisanori Tsuboi, Kanagawa (JP); Hidetomo Miyake, Kanagawa (JP); Takeshi Yamamoto, Tokyo (JP)

(73) Assignee: Sony Corporation

( * ) Notice: Subject to any disclaimer, the term of this patent is extended or adjusted under 35 U.S.C. 154(b) by 0 days.

This patent is subject to a terminal disclaimer.

(21) Appl. No.: 16/801,859

(22) Filed: Feb. 26, 2020

(65) Prior Publication Data

US 2020/0192143 A1 Jun. 18, 2020

Related U.S. Application Data

(63) Continuation of application No. 16/298,572, filed on Mar. 11, 2019, now Pat. No. 10,613,364, which is a
(Continued)

(30) Foreign Application Priority Data

May 24, 2011 (JP) .................................. 2011-116243
Apr. 27, 2012 (JP) .................................. 2012-102345

(51) Int. Cl.
*G02F 1/1333* (2006.01)
*G02F 1/13357* (2006.01)
(Continued)

(52) U.S. Cl.
CPC ........ *G02F 1/133308* (2013.01); *F21V 11/00* (2013.01); *G02B 6/0011* (2013.01);
(Continued)

(58) Field of Classification Search
CPC ...... H05K 5/0017; H05K 7/1427; F21V 11/00
See application file for complete search history.

(56) References Cited

U.S. PATENT DOCUMENTS 5,701,055 A * 12/1997 Nagayama .......... H01L 27/3246
313/504
6,259,496 B1 7/2001 Kashima
(Continued)

FOREIGN PATENT DOCUMENTS

JP 2003255851 A 9/2003
JP 2008103150 A 5/2008
(Continued)

OTHER PUBLICATIONS

EP Communication pursuant to Article 94(3) EPC for EP Application No. 12166113.6, dated Oct. 6, 2015.
(Continued)

*Primary Examiner* — Mary Ellen Bowman
(74) *Attorney, Agent, or Firm* — Lerner, David, Littenberg, Krumholz & Mentlik, LLP

(57) ABSTRACT

A display which thickness is allowed to be reduced is provided. A display includes: a display panel; and a back-face member having rigidity and provided on a back face of the display panel, the back-face member covering the back face, or the back face and other part of the display panel.

15 Claims, 5 Drawing Sheets

Related U.S. Application Data continuation of application No. 15/062,420, filed on Mar. 7, 2016, now Pat. No. 10,268,059, which is a continuation of application No. 14/851,099, filed on Sep. 11, 2015, now Pat. No. 9,332,660, which is a continuation of application No. 14/118,051, filed as application No. PCT/JP2012/063344 on May 24, 2012, now Pat. No. 9,277,667.

(51) Int. Cl.

| | | |
|---|---|---|
| *H05K 5/02* | (2006.01) | |
| *G09F 9/30* | (2006.01) | |
| *F21V 8/00* | (2006.01) | |
| *H05K 7/02* | (2006.01) | |
| *F21V 11/00* | (2015.01) | |
| *H05B 33/22* | (2006.01) | |
| *H05K 5/00* | (2006.01) | |
| *H05K 7/14* | (2006.01) | |
| *G02F 1/1335* | (2006.01) | |
| *G02F 1/1343* | (2006.01) | |
| *G02F 1/1368* | (2006.01) | |
| *G02F 1/137* | (2006.01) | |

(52) U.S. Cl.
CPC ......... *G02F 1/133608* (2013.01); *G09F 9/30* (2013.01); *H05B 33/22* (2013.01); *H05K 5/0017* (2013.01); *H05K 5/02* (2013.01); *H05K 7/023* (2013.01); *H05K 7/1427* (2013.01); *G02B 6/0041* (2013.01); *G02B 6/0088* (2013.01); *G02B 6/0093* (2013.01); *G02F 1/137* (2013.01); *G02F 1/1368* (2013.01); *G02F 1/13439* (2013.01); *G02F 1/133514* (2013.01); *G02F 1/133528* (2013.01); *G02F 2001/13332* (2013.01); *G02F 2001/13712* (2013.01); *G02F 2001/133302* (2013.01); *G02F 2001/133314* (2013.01); *G02F 2201/123* (2013.01)

(56) References Cited

U.S. PATENT DOCUMENTS

| | | | |
|---|---|---|---|
| 7,120,010 | B2 | 10/2006 | Tajima |
| 8,419,202 | B2 | 4/2013 | Ogura et al. |
| 8,797,721 | B2 | 8/2014 | Pakula et al. |
| 9,277,667 | B2 | 3/2016 | Fujii et al. |
| 2002/0001184 | A1 | 1/2002 | Kim et al. |
| 2003/0063231 | A1 | 4/2003 | Dai et al. |
| 2003/0117053 | A1* | 6/2003 | Tajima ............... G02F 1/133308 313/292 |
| 2003/0128307 | A1 | 7/2003 | Ito et al. |
| 2005/0007322 | A1* | 1/2005 | Adachi ............... H01L 27/3248 345/82 |
| 2005/0017268 | A1* | 1/2005 | Tsukamoto ......... H01L 27/3293 257/200 |
| 2005/0184662 | A1* | 8/2005 | Cok ...................... H01L 51/529 313/512 |
| 2006/0290836 | A1 | 12/2006 | Chang |
| 2008/0094831 | A1 | 4/2008 | Matsumoto |
| 2008/0120946 | A1 | 5/2008 | Bayne et al. |
| 2009/0066241 | A1* | 3/2009 | Yokoyama ............. H05B 33/22 313/504 |
| 2009/0154198 | A1 | 6/2009 | Lee et al. |
| 2009/0185100 | A1 | 7/2009 | Matsuhira et al. |
| 2010/0302473 | A1* | 12/2010 | Poveda ............. G02F 1/133308 349/58 |
| 2010/0315570 | A1 | 12/2010 | Mathew et al. |
| 2011/0012865 | A1 | 1/2011 | Nozawa |
| 2011/0051348 | A1 | 3/2011 | Song |
| 2011/0109596 | A1 | 5/2011 | Yoon |
| 2011/0186345 | A1 | 8/2011 | Pakula et al. |
| 2011/0234545 | A1 | 9/2011 | Tanaka et al. |

FOREIGN PATENT DOCUMENTS

| | | |
|---|---|---|
| JP | 2008-304680 A | 12/2008 |
| JP | 2008304630 A | 12/2008 |
| JP | 2010157957 A | 7/2010 |
| WO | 2010082568 A1 | 7/2010 |

OTHER PUBLICATIONS

European Search Report EP 12166113, dated Oct. 12, 2012.
Extended European Search Report for Application No. 16184986.4 dated Sep. 28, 2016.
Extended European Search Report for Application No. 17178690, dated Aug. 17, 2017.
Extended European Search Report for EP Application No. 12790195.7, dated May 4, 2015.
Extended European Search Report including Written Opinion for EP Application No. 8180325.5 dated Jan. 23, 2019.
International Search Report PCT/JP2012/063344, dated Aug. 14, 2012.
U.S. Office Action for U.S. Appl. No. 14/118,051, dated Mar. 18, 2015.

* cited by examiner

[ FIG. 1 ]
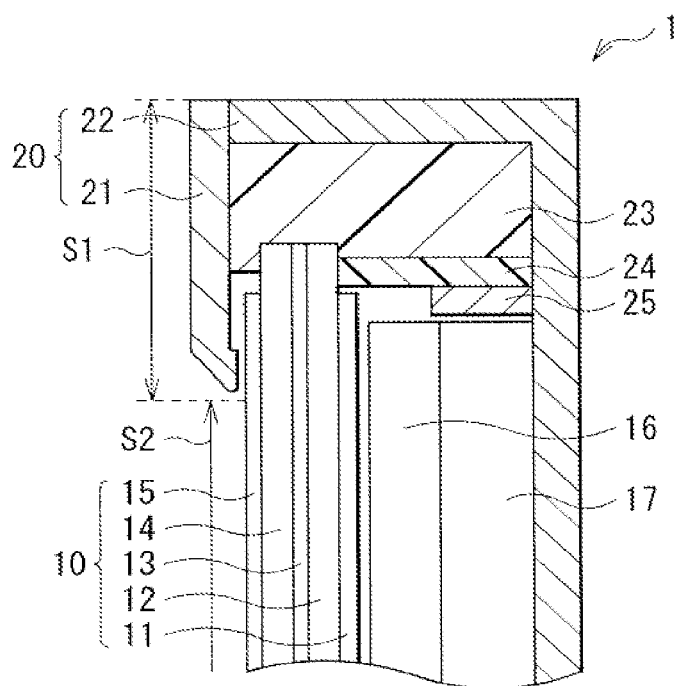

[ FIG. 2 ]
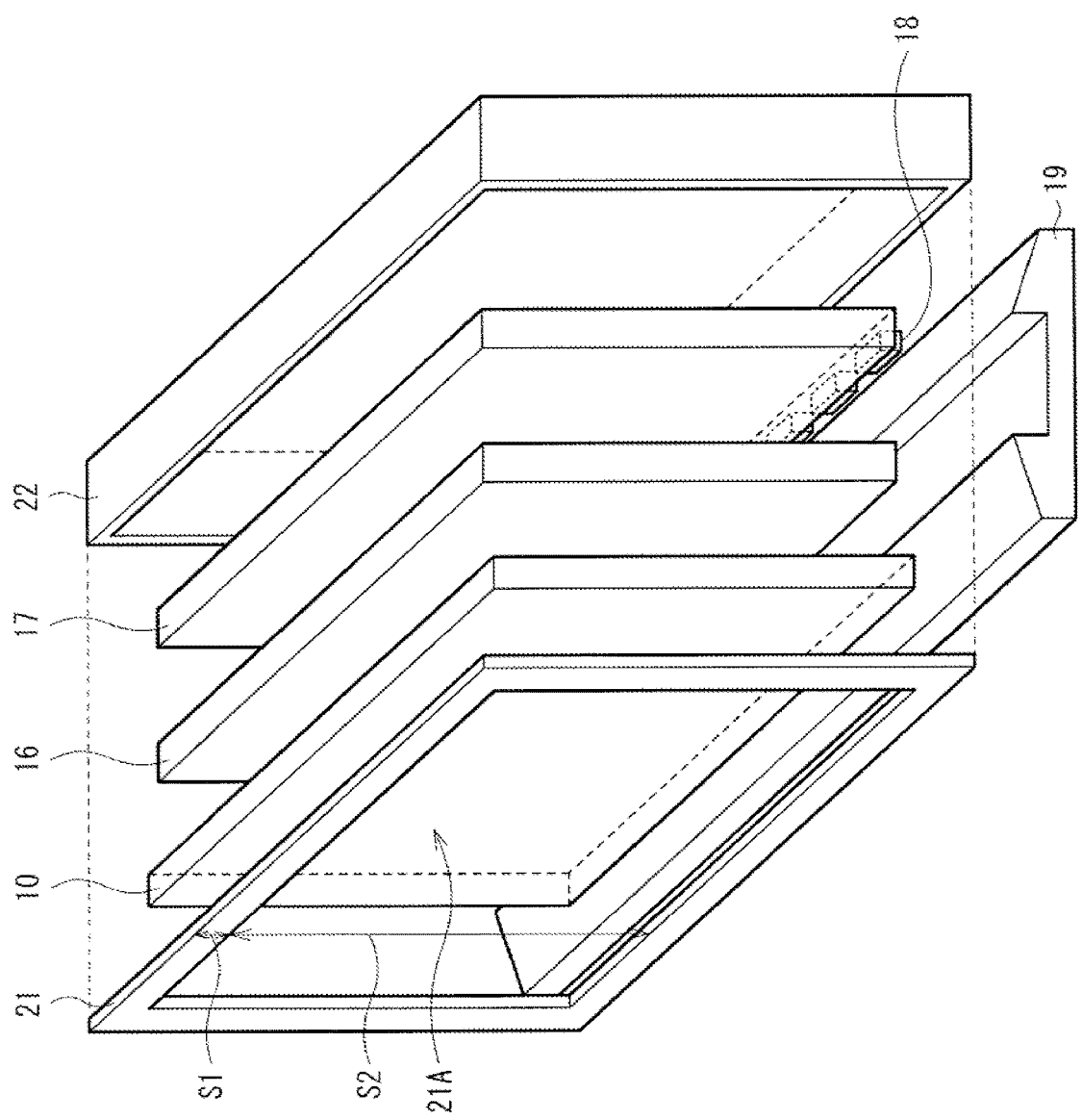

[ FIG. 3 ]
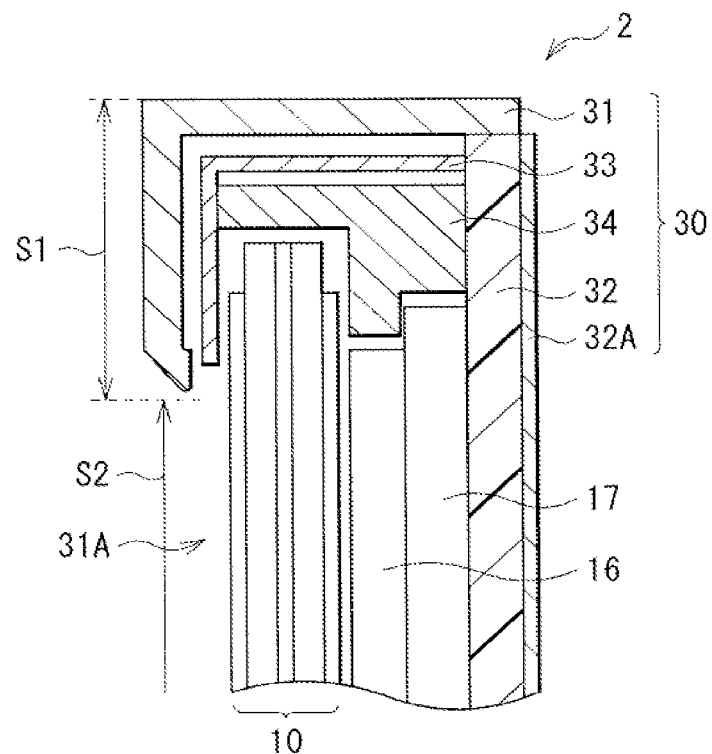
[ FIG. 4 ]
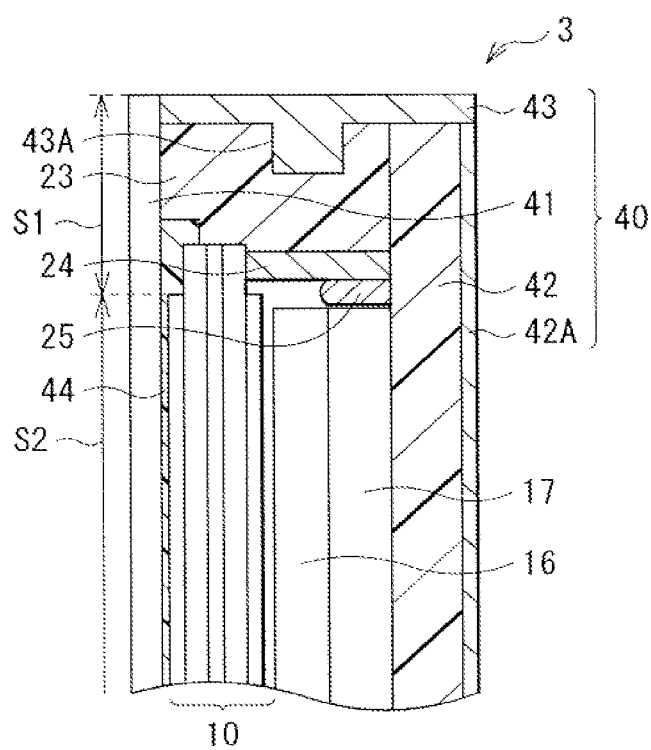

[ FIG. 5 ]
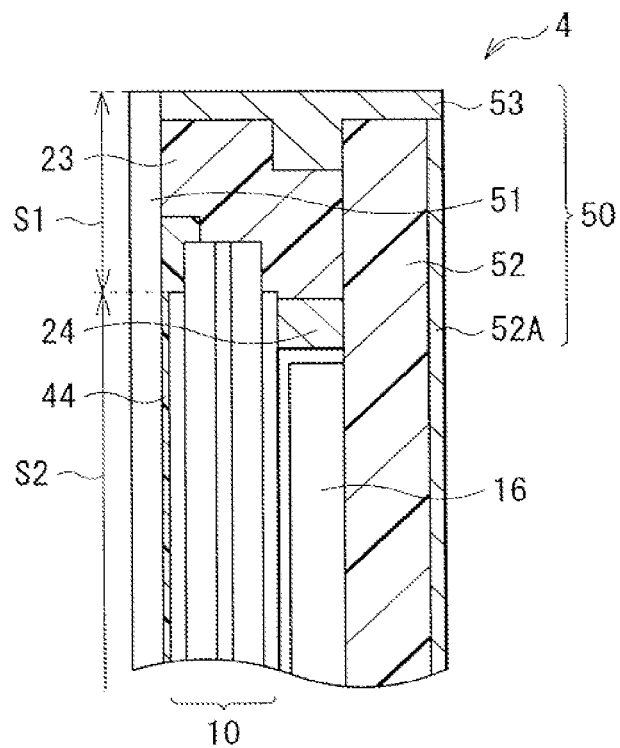
[ FIG. 6 ]
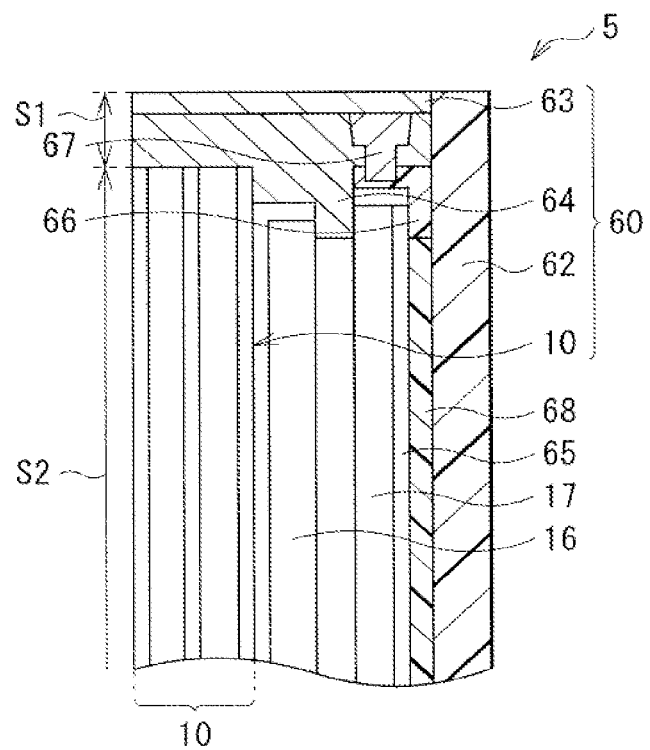

[FIG. 7]
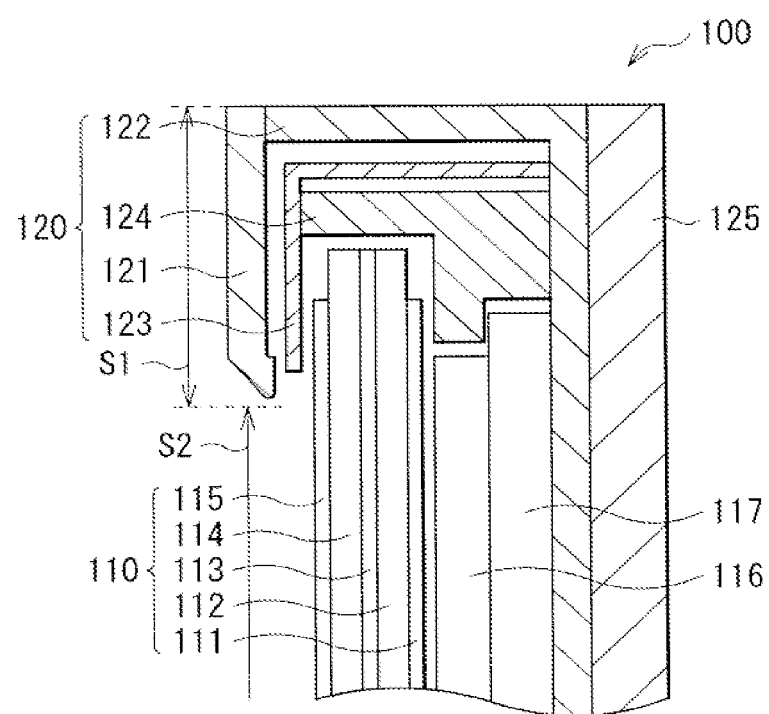

DISPLAY

CROSS-REFERENCE TO RELATED APPLICATIONS

The present application is a continuation of U.S. application Ser. No. 16/298,572, filed on Mar. 11, 2019, which is a continuation of U.S. patent application Ser. No. 15/062,420, filed on Mar. 7, 2016, issued as U.S. Pat. No. 10,268,059 on Apr. 23, 2019, which is a continuation of U.S. patent application Ser. No. 14/851,099 filed Sep. 11, 2015, issued as U.S. Pat. No. 9,332,660 on May 3, 2016, which is a continuation of U.S. patent application Ser. No. 14/118,051 filed on Nov. 15, 2013, issued as U.S. Pat. No. 9,277,667 on Mar. 1, 2016, which is a national phase entry under 35 U.S.C. § 371 of International Application No. PCT/JP2012/063344, filed on May 24, 2012, published on Nov. 29, 2012, as WO 2012/161260 A1, which claims priority from Japanese Patent Application Nos. JP 2011-116243, filed in the Japanese Patent Office on May 24, 2011 and JP 2012-102345 filed in the Japanese Patent Office on Apr. 27, 2012, all of which are hereby incorporated herein by reference.

TECHNICAL FIELD

The present disclosure relates to a display such as a television device.

BACKGROUND ART

There has been a demand for thinner and more lightweight displays, as displays represented by liquid crystal displays, organic electroluminescence displays, electrophoresis-type displays, and the like. In a typical display, a display panel is contained in a housing, and this housing is configured of a front-face housing and a rear-face housing. The front-face housing includes a front bezel, a top chassis, and the like provided on a display surface side of the display panel. The rear-face housing includes a back chassis, a frame, back-face cover, and the like covering a back-face side of the display panel (for example, see Patent Literature 1).

SUMMARY OF THE INVENTION

In recent years, designability for appearance of displays such as liquid crystal displays has been improved by advance of technology for display panels and electronic components. However, reducing thickness of the displays and narrowing of frames have been desired for further improvements. Nevertheless, in a currently-available display, as in the above-described Patent Literature 1, the housing containing the liquid crystal panel, the rear-face housing in particular, is configured of a plurality of members such as the back chassis, the frame, the back-face cover, and the like, which has prevented a reduction in thickness.

Accordingly, it is desirable to provide a display whose thickness is allowed to be reduced.

A display according to an embodiment of the present technology includes: a display panel; and a back-face member having rigidity and provided on a back face of the display panel, the back-face member covering the back face, or the back face and other part of the display panel.

In the display according to the embodiment of the present technology, the back-face member covering the back face of the display panel is configured of a rigid member, and thus, it is possible to simplify a member configuration.

According to the display of the embodiment of the present technology, a member having rigidity is used as the back-face member of the display panel. Therefore, the configuration of the back-face member is simplified, and thereby, it is possible to reduce the thickness of the display.

BRIEF DESCRIPTION OF THE DRAWINGS

FIG. 1 is a cross-sectional diagram illustrating a configuration of a display according to a first embodiment of the present disclosure.

FIG. 2 is an exploded perspective view illustrating a configuration of the display depicted in FIG. 1.

FIG. 3 is a cross-sectional diagram illustrating a configuration of a display according to a second embodiment of the present disclosure.

FIG. 4 is a cross-sectional diagram illustrating a configuration of a display according to a third embodiment of the present disclosure.

FIG. 5 is a cross-sectional diagram illustrating a configuration of a display according to a fourth embodiment of the present disclosure.

FIG. 6 is a cross-sectional diagram illustrating a configuration of a display according to a fifth embodiment of the present disclosure FIG. 7 is a cross-sectional diagram illustrating a configuration of a display according to an example of a related art.

MODE(S) FOR CARRYING OUT THE INVENTION

Some embodiments of the present disclosure will be described below in detail with reference to the drawings, in the following order.

1. First embodiment (a display in which a front bezel and a back chassis are adhered to each other with a sealant)
2. Second embodiment (a display in which a front bezel and a rear plate are connected to each other with a top chassis and a middle chassis)
3. Third embodiment (a display in which a front glass and a rear plate are adhered to each other with a sealant)
4. Fourth embodiment (a display in which a light-guiding plate serves as a back-face member)
5. Fifth embodiment (a display in which a display panel and a rear plate are connected to each other with a middle chassis)

1. First Embodiment

FIG. 1 is a diagram illustrating a cross-sectional configuration of a display (a display 1) according to a first embodiment of the present disclosure, and FIG. 2 is an exploded perspective view illustrating an overall configuration of the display 1. The display 1 may be, for example, a liquid crystal display used as a television device. This display 1 has a configuration in which: a backlight unit is contained in a housing 20 including a front bezel 21 (front-face member) and a back chassis 22 (back-face member); the backlight unit includes a display panel 10, an optical sheet 16, a light-guiding plate 17, a light source 18, and the like; and the front bezel 21 and the back chassis 22 are adhered to each other with an adhesion member 23. On one end surface of the light-guiding plate 17, a plurality of LEDs are arranged as the light source 18, and light emitted from this light source 18 irradiates the display panel 10 via the light-guiding plate 17, and is extracted as display light toward the front bezel 21.

The display panel 10 displays an image such as a moving image or a still image, and may be, for example, a liquid crystal display panel having a liquid crystal layer 13 between two substrates, i.e., a TFT substrate 12 and a CF substrate 14. Further, polarizing plates 11 and 15 allowing polarized light in a specific direction to pass therethrough are provided on a surface (front face (display surface) of the TFT substrate 12 and a surface (back face) of the CF substrate 14, respectively, the surfaces being opposite to surfaces where the liquid crystal layer 13 is provided.

The TFT substrate 12 may be configured by, for example, arranging a plurality of pixel electrodes (not illustrated) in a matrix on a glass substrate. This TFT substrate 12 is provided with TFT (Thin Film Transistor) devices driving the respective pixel electrodes, gate lines and source lines connected to these TFT devices, and the like (none is illustrated). The pixel electrodes may be formed of, for example, a conductive material having transparency such as ITO (Indium Tin Oxide), and are each provided for every sub-pixel (not illustrated) on the glass substrate.

The CF substrate 14 may have, for example, a color filter (not illustrated) with, for example, stripe-shaped filters of red (R), green (G), and blue (B) on a glass substrate, and may have a counter electrode (not illustrated) over almost the entire surface of an effective display region S2 on this color filter. The counter electrode may be configured using, for example, a conductive material having transparency such as ITO, like the pixel electrodes described above. It is to be noted that, although not illustrated here, a spacer may be provided between the counter electrode and the pixel electrodes on the TFT substrate 12 side, thereby keeping a gap between these substrates.

For example, in a case of a liquid crystal panel of a vertical alignment type, the liquid crystal layer 13 may include liquid crystal molecules having negative dielectric constant anisotropy, and a polymer structure holding the liquid crystal molecules in proximity to an interface with an alignment film (not illustrated). A liquid crystal molecule has a property in which a dielectric constant in a major axis direction is larger than that in a minor axis direction. Based on this property, the liquid crystal molecule is arranged to allow the major axis of the liquid crystal molecule to be perpendicular to a substrate when a drive voltage is OFF, and the liquid crystal molecule is oriented to allow the major axis of the liquid crystal molecule to be parallel to the substrate when the drive voltage is ON. Thus, an image is displayed on the liquid crystal display panel.

The optical sheet 16 is a sheet implementing various optical functions for the light being emitted from the light source 18 and irradiating the display panel 10 through the light-guiding plate 17. As the optical sheet 16, for example, sheets having a function of decomposing display light entering the display panel 10 from the light source 18 through the light-guiding plate 17, into incident light and a polarized light component orthogonal to the incident light, a function of achieving a wide viewing angle or prevention of coloring by ensuring a phase difference between light waves, a function of diffusing the display light, and/or the like may be used as a single layer or as laminated layers.

The light-guiding plate 17 allows the light entering from the light source 18 to propagate therethrough, thereby guiding this light to the display panel 10, and may have, for example, a rectangular flat shape. As a material of the light-guiding plate 17, a material having high transparency such as glass may be used, but the light-guiding plate 17 may be configured using other materials as long as the material allows the light from the light source 18 to propagate therethrough. For example, a light scattering material in which light scattering fine particles are dispersed, or a light diffusion material may be employed to form the light-guiding plate 17. Specifically, acrylic resin, polymethyl methacrylate (PMMA), polycarbonate (PC), cyclic polyolefin (COP), or the like may be used. A shape, a size, a refractive index, density, density distribution, and the like of the light-guiding plate 17 may be adjusted arbitrarily to obtain desirable characteristics.

For the light source 18, for example, in addition to a white LED (Light Emitting Diode), LEDs emitting light of red, blue, green, and the like may be used. Further, other than a point light source such as LED, a linear light source such as a fluorescent light may be used. As illustrated in FIG. 2, here, the light source 18 is provided on the one end surface (undersurface) of the light-guiding plate 17, but is not limited to this, and may be disposed along four sides of the light-guiding plate 17.

The housing 20 may be, for example, substantially shaped like a rectangular solid, and has two opposed surfaces, namely, a display surface and a back face, and also has side faces between these two surfaces. In other words, the housing 20 in the present embodiment is configured of a front-face plate (the front bezel 21) and a back-face plate (the back chassis 22). The front-face plate covers at least part of a front face of the display panel 10 (for example, a circumferential edge portion of the display panel 10), and the back-face plate covers a back face and side faces between the front face and the back face of the display panel 10.

The front bezel 21 is a frame used to fix the display panel 10 provided on the front-face side of the display panel 10, as described above. An opening 21A of the front bezel 21 allows an image displayed on the display panel 10 to be viewed. As a material of the front bezel 21, for example, metal having high thermal conductivity, specifically, aluminum (Al), may be used. Besides this, iron (Fe), polycarbonate (PC), plastic in which ABS resin is added to PC, or the like can be used.

The back chassis 22 is also used to fix the display panel 10, while covering at least the back face of the display panel 10, and, here, covering the back face and the side faces between the front face and the back face of the display panel 10 as described above. As a material of the back chassis 22, for example, metal having high thermal conductivity, specifically, Al may be used, as with the front bezel 21. Besides this, Fe or the like can be used.

In the present embodiment, the front bezel 21 and the back chassis 22 are adhered to each other with the adhesion member 23 (sealant). A connection member (for example, a middle chassis or the like) used to connect the front bezel 21 and the back chassis 22 to each other is omitted by integrating the front bezel 21 and the back chassis 22 with this adhesion member 23. Examples of the adhesion member 23 may include adhesives having sufficient adhesive strength and elasticity, which are, specifically, adhesives such as acrylic resin, urethane resin, epoxy resin, vinyl chloride resin, and modified silicone resin. Further, when the front bezel 21 and the back chassis 22 are adhered to each other with the adhesion member 23 as in the present embodiment, it is preferable to configure the front bezel 21 and the back chassis 22 with the same material, thereby improving bond strength and the like. Further, for example, a metallic material may be preferably used for shielding electromagnetic waves caused by various circuits and electronic components provided inside the display 1. This reduces unnecessary radiation caused by the various circuits and electronic components provided inside the display 1.

It is to be noted that, here, the adhesion member 23 also has a function of serving as a sealing section of the display panel 10, by covering part of the side faces, the front face, and the back face of the display panel 10. Further, a spacer 24 is provided between the display panel 10 and the back chassis 22. Thus, a space between the display panel 10 and the back chassis 22 is secured and a region where the adhesion member 23 is formed is partitioned. Furthermore, a piece of PORON 25 positioning the light-guiding plate 17 and absorbing linear expansion of the light-guiding plate 17 is provided between the spacer 24 and the light-guiding plate 17, but may be omitted.

As illustrated in FIG. 2, the display 1 is completed by containing the display panel 10, the optical sheet 16, the light-guiding plate 17, and the like in the housing 20 configured of the front bezel 21 and the back chassis 22, and then by installing the housing 20 in a stand 19 provided with a drive substrate of the light source 18, a speaker, and the like. The stand 19 may be, for example, a fixed base having a rectangular flat shape (a paperweight structure), but is not limited to this, and may have a tilt-swivel mechanism capable of changing an orientation of a screen of the display panel 10 vertically and laterally.

In this display 1, when the light emitted from the light source 18 enters the display panel 10 through the light-guiding plate 17 and the optical sheet 16, the entered light passes through the polarizing plate 11 and then passes through the liquid crystal layer 13 while being modulated for every pixel, based on an image voltage applied between transparent electrodes of the TFT substrate 12 and the CF substrate 14. After passing through the liquid crystal layer 13, the light passes through the color filter, thereby being extracted as color display light to an outer side (a surface side) of the polarizing plate 15.

FIG. 7 illustrates a cross-sectional configuration of a display 100 of a related art. In the display 100, a display panel 110, an optical sheet 116, and a light-guiding plate 117 are contained in a housing 120, as in the display 1 of the above-described present embodiment. This housing 120 is configured of a front bezel 121, a back chassis 122, a top chassis 123, and a middle chassis 124. In the display 100 of the related art, the top chassis 123 and the middle chassis 124 are disposed between the front bezel 121 and the back chassis 122, and the front bezel 121 and the back chassis 122 are connected with this top chassis 123 and the middle chassis 124. Specifically, the top chassis 123 and the back chassis 122 are fixed with screws (not illustrated) with the middle chassis 124 in between. A panel module assembled in this way is sandwiched between the front bezel 121 and a rear cover 125, and is fixed with screws (not illustrated). Therefore, a region used to fix the above-described housing 120 with the screws has been necessary in a frame region 51 of the display 100. In addition, the number of components including the top chassis 123, the middle chassis 124, the screws, and the like is large, which increases weight.

In contrast, in the display 1 of the present embodiment, the housing 20 has two components, namely, the front bezel 21 and the back chassis 22, and the front bezel 21 and the back chassis 22 are adhered to each other with the adhesion member 23. In other words, the region used to fix the housing 120 with the screws may not necessarily be secured in the frame region 51 as in the display 100 of the related art. Therefore, it is possible to reduce the frame region 51. In addition, connection members (the top chassis 123, the middle chassis 124, and the screws) connecting the front bezel 121 and the back chassis 122 may be unnecessary. Therefore, cost is allowed to be slimmed down, and weight of the display 1 is allowed to be reduced.

As described above, in the display 1 of the present embodiment, the front bezel 21 and the back chassis 22 configuring the housing 20 are adhered to each other with the adhesion member 23. Therefore, it is possible to reduce a region used to connect the component members of the housing 20 in the frame region S1. In other words, it is possible to narrow the frame of the display 1.

Moreover, a connection member used to connect the component members (the front bezel 21 and the back chassis 22) of the housing 20 may be unnecessary. Therefore, it is possible to slim down the cost and reduce the weight of the display 1.

The second to fifth embodiments will be described below. It is to be noted that the same elements as those of the first embodiment will be provided with the same characters and thus, the description thereof will be omitted.

2. Second Embodiment

FIG. 3 illustrates a cross-sectional configuration of a display 2 according to the second embodiment of the present disclosure. The display 2 includes the display panel 10, the optical sheet 16, and the light-guiding plate 17 contained in a housing 30, and the display 2 is different from the display of the first embodiment in that this housing 30 is configured of a front bezel 31 (front-face member), a rear plate 32 (back-face member), a top chassis 33, and a middle chassis 34.

As in the above-described first embodiment, the housing 30 may be, for example, substantially shaped like a rectangular solid, and has two opposed surfaces, namely, a display surface and a back face, and also has side surfaces between these two surfaces. In other words, in the present embodiment, the front bezel 31 and the rear plate 32 are connected with the top chassis 33 and the middle chassis 34. The front bezel 31 serves as a front-face plate covering the display surface (front face) and the side faces of the display panel 10. The rear plate 32 serves as a back-face plate covering a back face of the display panel 10.

The front bezel 31 is a frame used to fix the display panel 10, as in the above-described first embodiment. An opening 31A of the front bezel 31 allows an image displayed on the display panel 10 to be viewed. As a material of the front bezel 31, for example, metal having high thermal conductivity, specifically, Al may be used. Besides this, Fe, polycarbonate (PC), plastic in which ABS resin is added to PC, or the like may be used.

The rear plate 32 is provided to cover the back face of the display panel 10 as described above, and also to support the entire display 2. The rear plate 32 is a member having rigidity. Further, a member having a high Young's modulus or a low linear expansion coefficient may be preferably used. Specifically, glass, ceramic, or metal such as Al and Fe, having a thickness of about 1.0 mm to about 3.0 mm both inclusive may be used. In the present embodiment, the member having rigidity is used as the back-face member of the housing 30. Therefore, it is possible to support the entire display 2 without using the back chassis 22, a support member to support the display 1 such as an outer member (for example, the rear cover 125 (see FIG. 7)), and/or the like.

Further, on the entire back face of the rear plate 32, a light-shielding film 32A is provided to prevent external light from entering into the display 2. Examples of this light-shielding film 32A may include a resin film such as a black film into which a black coloring agent is mixed and which has an optical density of 1 or more.

The top chassis 33 and the middle chassis 34 are provided to connect the front bezel 31 and the rear plate 32 to each other as described above. Examples of a material of each of the top chassis 33 and the middle chassis 34 may include metal such as Al and Fe, similarly to the material of the back chassis 22 in the above-described first embodiment. It is to be noted that the top chassis 33 and the middle chassis 34 may be molded using a material having thermal conductivity lower than that of metal, which is, for example, a synthetic resin or the like. Use of the material having low thermal conductivity suppresses transmission of heat produced in the light source 18 to the front bezel 31, and makes it possible to radiate heat from the back-face side efficiently, while suppressing a temperature rise on the front-face side of the display 2.

In this display 2, light emitted from the light source 18 enters the display panel 10 through the light-guiding plate 17 and the optical sheet 16, in a manner similar to that in the above-described first embodiment. This entered light passes through the polarizing plate 11, and then passes through the liquid crystal layer 13, while being modulated for every pixel, based on an image voltage applied between transparent electrodes of the TFT substrate 12 and the CF substrate 14. After passing through the liquid crystal layer 13, the light passes through a color filter, thereby being extracted as color display light to an outer side (a surface side) of the polarizing plate 15.

FIG. 7 illustrates the cross-sectional configuration of the display 100 of the related art. However, on the back face of this display 100, a back-face housing including the back chassis 122 and the like, and the outer member including the rear cover 125 and the like are provided to contain the display panel 110 and support the entire display 100.

In contrast, in the display 2 of the present embodiment, the back-face plate (the rear plate 32) having rigidity is used for the entire back face of the display panel 10, of the housing 30 containing the display panel 10. This allows one member to serve in place of a plurality of members including the back chassis 122, the rear cover 125, and the like used to support the typical display 100.

As described above, in the display 2 of the present embodiment, the material having rigidity is used for the back-face plate covering the entire back face of the display panel 10. Therefore, the display panel, which is supported using, in the related art, the plurality of members such as the back chassis 122 and the rear cover 125, is allowed to be supported with one member (the rear plate 32). In other words, it is possible to reduce the thickness of the display 2.

Further, it is possible to reduce the number of components of the support members configuring the display 2 as in the above-described first embodiment. Therefore, cost is allowed to be slimmed down, and the weight of the display 2 is allowed to be reduced.

3. Third Embodiment

FIG. 4 illustrates a cross-sectional configuration of a display 3 according to a third embodiment of the present disclosure. The display 3 includes the display panel 10, the optical sheet 16, and the light-guiding plate 17 contained in a housing 40, and the display 3 is different from the first and second embodiments in that this housing 40 is configured of a front glass 41 (front-face member, transparent plate), a rear plate 42 (back-face member), and a decoration frame 43, the front glass 41 being provided on a front face of the display panel 10 with a sealing layer 44 in between. It is to be noted that the front glass 41 (front-face member), the rear plate 42 (back-face member), and the decoration frame 43 are adhered to one another with the adhesion member 23.

The front glass 41 is a plate-like member provided on the entire front face of the display panel 10 with the sealing layer 44 in between as described above, and is configured using a material of high transparency, such as glass, polycarbonate (PC), and plastic in which ABS resin is added to PC. The front glass 41 has, for example, a thickness of about 0.5 mm to about 3.5 mm both inclusive, and protects an display region S2 of the display panel 10, and also supports the display 3 in cooperation with the rear plate 42 which will be described later.

The rear plate 42 is provided to cover the entire back-face side of the display panel 10 as described above, and also to support the entire display 3, as in the above-described second embodiment. The rear plate 42 is a member having rigidity, and may be made of, for example, glass or metal such as Al and Fe having a thickness of about 1.0 mm to about 3.0 mm both inclusive. In addition, the front glass 41 and the rear plate 42 are adhered to each other with the adhesion member 23 as described above. Therefore, materials having the same or similar properties may be preferably used as the materials of the front glass 41 and the rear plate 42. Specifically, glass may be desirably used in view of transparency desired for the front glass 41, rigidity desired for a support member of the display, and a difference in expansion coefficient with respect to the display panel 10. Further, on the entire back face of the rear plate 42, a light-shielding film 42A is provided to prevent entrance of external light into the display 3, as in the above-described second embodiment.

The decoration frame 43 is provided to cover side faces between a front face and a back face of the display 3, and also to seal the adhesion member 23 used to connect the front glass 41 and the rear plate 42 to each other. As a material of the decoration frame 43, for example, the material of the back chassis 22 in the above-described first embodiment, metal such as Al and Fe, or the like may be used. It is to be noted that the decoration frame 43 may be a flat-plate-like member, but as illustrated in FIG. 4, the decoration frame 43 may have a protrusion section 43A in a sealing direction of the adhesion member 23. By providing this protrusion section 43A, an amount of the adhesion member 23 used to adhere the front glass 41 and the rear plate 42 to each other may be reduced. In addition, positioning of members configuring the display 3 (for example, see FIG. 5) may be performed by appropriately adjusting a position where the protrusion section 43A is formed.

The sealing layer 44 is provided to seal a space between the display panel 10 and the front glass 41, and may be configured using, for example, resin or the like having a photo-hardening property, a thermosetting property, a moisture-curing property, an aerobic-curing property, or a hot-melt property, or any combinations of these properties. It is to be noted that the sealing layer 44 may be omitted, but by sealing the space between the display panel 10 and the front glass 41 with the sealing layer 44, strength is improved and also image quality is improved. Moreover, designability is also improved.

In the display 3 of the present embodiment, the materials having rigidity and the same or similar properties are used for the front glass 41 and the rear plate 42 configuring the housing 40, and the front face and the back face of the display panel 10 are covered by the front glass 41 and the rear plate 42. This simplifies a back-face member provided on the back-face side of the display panel 10, such as a back-face housing and an outer member, and thereby, it is possible to reduce thickness of the display 3. Furthermore, since the front glass 41 and the rear plate 42 are adhered to each other with the adhesion member 23, it is possible to reduce the frame region S1. In other words, it is possible to reduce the thickness of the display 3 and to narrow the frame thereof at the same time.

4. Fourth Embodiment

FIG. 5 illustrates a cross-sectional configuration of a display 4 according to a fourth embodiment of the present disclosure. In the display 4, the display panel 10 and the optical sheet 16 are contained in a housing 50, and this housing 50 is configured of a front glass 51 (front-face member) provided on a front face of the display panel 10 with the sealing layer 44 in between, a light-guiding plate 52 (back-face member), and a decoration frame 53. In the display 4 of the present embodiment, the light-guiding plate 52 is used as a back-face member, which is different from the above-described first to third embodiments. It is to be noted that the front glass 51, the light-guiding plate 52, and the decoration frame 53 are adhered to one another with the adhesion member 23.

As in the above-described third embodiment, the front glass 51 is provided on the front face of the display panel 10, and is made of a material having high transparency, such as glass, polycarbonate (PC), and plastic in which ABS resin is added to PC. The front glass 51 may have, for example, a thickness of about 0.5 mm to about 3.5 mm both inclusive, and protects the display region S2 of the display panel 10. Also, the front glass 51 supports the display 4 in cooperation with the light-guiding plate 52 which will be described later.

The light-guiding plate 52 covers the entire back face of the display panel 10 as described above, and may be configured using a material having the same or similar property as that of the above-described front glass 51, which may be, for example, a member having rigidity and capable of supporting the entire display 4, like the third embodiment. Specifically, for example, glass, metal such as Al and Fe, or the like having a thickness of about 1.0 mm to about 3.0 mm both inclusive may be used. Further, on the entire back face of the light-guiding plate 52, a light-shielding film 52A is provided to prevent entrance of external light into the display 4. This light-shielding film 52A may be configured using, for example, a resin film such as a black film into which a black coloring agent is mixed and which has an optical density of 1 or more, as in the above-described second and third embodiments. Of these, a black resin film may be preferable to be used, because the light-shielding film 52A is allowed to be formed easily at a low cost.

The decoration frame 53 is provided to cover side faces between a front face and a back face of the display 4, and also to seal the adhesion member 23 connecting the front glass 51 which is the front-face member and the light-guiding plate 52 which is the back-face member to each other, as in the above-described third embodiment. As a material of the decoration frame 53, a material similar to that in the above-described third embodiment may be used.

In the display 4 of the present embodiment, the light-guiding plate 52 configured using the material having transparency and rigidity is provided as a back-face plate covering the back face of the display panel 10. Therefore, it is possible to further reduce thickness of the display 4, in addition to achieving effects of the above-described third embodiment. Further, it is possible to reduce the number of components configuring the display 4. Therefore, an effect of further reducing cost is achieved.

5. Fifth Embodiment

FIG. 6 illustrates a cross-sectional configuration of a display 5 according to a fifth embodiment of the present disclosure. In this display 5, the front-face member is not provided, and the display panel 10 and a rear plate 62 are connected to each other with a middle chassis 64. In other words, a housing 60 that contains the display panel 10, the optical sheet 16, the light-guiding plate 17, a reflective sheet 65, and the like that configure the display 5 is configured of the rear plate 62 and the middle chassis 64, and the display panel 10 is exposed at the front face of the display 5. It is to be noted that the reflective sheet 65 reflects, in the front-face direction, light that propagates in the light-guiding plate 17 and is reflected in the back-face direction, and may be omitted. The present embodiment is different from the above-described first to fourth embodiments in that the front-face member is not provided.

The rear plate 62 is provided to cover the back face of the display panel 10 as described above, and also to support the entire display 5. The rear plate 62 is a member having rigidity as in the above-described second embodiment and the like. Further, a member having a high Young's modulus or a low linear expansion coefficient may be preferably used for the rear plate 62. Specifically, glass, ceramic, or metal such as Al and Fe, having a thickness of about 1.0 mm to about 3.0 mm both inclusive may be used. It is to be noted that the rear plate 62 may desirably have light shielding properties, and for example, a light-shielding film may be provided on the entire back face of the rear plate 62 as in the above-described second embodiment. This prevents entrance of external light into the display 5. Examples of the light-shielding film may include a resin film such as a black film into which a black coloring agent is mixed and which has an optical density of 1 or more.

The middle chassis 64 are provided to connect the display panel 10 and the rear plate 62 to each other as described above. As a material of the middle chassis 64, for example, the material of the back chassis 22 in the above-described first embodiment, metal such as Al and Fe, and/or the like may be used. It is to be noted that a material having lower thermal conductivity than metal, for example, a material such as a synthetic resin may be used for molding. Further, the middle chassis 64 may be configured, for example, of four members that are dividable into top, bottom, right, and left members when the display panel 10 is rectangular.

In the present embodiment, the housing 60 is configured of the rear plate 62 and the middle chassis 64 as described above. Specifically, the rear plate 62 and the middle chassis 64 are connected to each other by fixing, for example, an affixing plate 66 made of metal at a predetermined position of the rear plate 62 with the use of a double-sided tape and/or the like, and fixing the affixing plate 66 and the middle chassis 64 to each other with the use of a screw 67. Further, the middle chassis 64 and the display panel 10 are connected to each other, for example, with the use of a photocurable resin, a double-faced tape, and/or the like. It is to be noted that a decoration frame 63 may be provided on a surface of the middle chassis 64 in view of reinforcement of the housing 60 and designability, as in the above-described third embodiment.

It is to be noted that, in the present embodiment, for example, a frame-like reinforcing frame 68 may be provided in a space between the reflective sheet 65 and the rear plate 62 that is caused by the affixing plate 66 provided to connect the rear plate 62 and the middle chassis 64 to each other. This reinforcing frame 68 may preferably have rigidity, and a member having a high Young's modulus or a low linear expansion coefficient may be preferably used therefore, as with the rear plate 62. Specifically, glass, ceramic, or metal such as Al and Fe may be used. Further, the reinforcing frame 68 and the rear plate 62 may be preferably fixed to each other, for example, with the use of a double-faced tape. For example, in a case where the rear plate 62 is formed of glass in the display 5, provision of the reinforcing frame 68 may allow the display 5 to stand by itself even when the glass is broken. It is to be noted that, although the reinforcing frame 68 has a frame-like shape in this example, the shape of the reinforcing frame 68 is not limited thereto as long as the shape allows self-standability of the display 5 to be improved. For example, the reinforcing frame 68 may have a plate-like shape, a fence-like shape, or a lattice-like shape.

As described above, in the display 5 according to the present embodiment, the front-face member is not provided, and the display panel 10 and the rear plate 62 that is formed of a material having rigidity and serves as the back-face member are connected to each other with the middle chassis 64. Therefore, it is possible to further reduce the thickness in addition to the effects in the above-described second embodiment. Further, it is possible to reduce the number of components configuring the display 5. Therefore, cost is allowed to be further slimmed down, and the weight of the display 5 is allowed to be reduced.

The present technology has been described using the first to fifth embodiments, but the present technology is not limited to the above-described embodiments and may be variously modified. For example, the liquid crystal display is used as an example of the display 1 in the above-described embodiment, but a plasma display, an organic electroluminescence display, or the like may be adopted.

Further, each of the members and thicknesses in the above-described embodiments is described as an example. Not all the members may necessarily be provided, or other members may be further provided. For example, as a system of radiating heat produced by the light source 18, a heat sink may be adhered to part or all of the back face of the display, for example, to a lower end part where the light source 18 is provided. For the heat sink, metal superior in thermal conductivity may be desirably used, and, for example, a material formed by molding a block made of Al or the like may be used. Further, in the display described in each of the above-described embodiments, the polarizing plate is provided on a surface of the display panel, but is not limited to this example, and may be, for example, provided on a surface of the front glass.

It is to be noted that it is possible to achieve at least the following configurations by the present technology.

(1) A display including:
a display panel; and
a back-face member having rigidity and provided on a back face of the display panel, the back-face member covering the back face, or the back face and other part of the display panel.
(2) The display according to (1), further including
a front-face member provided on a front face of the display panel, the front-face member covering a circumferential edge portion, or the circumferential edge portion and other part of the display panel.
(3) The display according to (2), wherein the front-face member is a frame covering the circumferential edge portion of the display panel.
(4) The display according to (2) or (3), wherein the front-face member is a transparent plate covering the front face of the display panel.
(5) The display according to any one of (2) to (4), wherein the front-face member and the back-face member are made of a same material.
(6) The display according to any one of (2) to (5), wherein each of the front-face member and the back-face member is made of glass.
(7) The display according to (1), wherein the front-face member is not included and the display panel is exposed at front.
(8) The display according to any one of (1) to (7), further including
a backlight unit including a light source, an optical sheet, and a light-guiding plate, the backlight unit being provided between the display panel and the back-face member, wherein
the light-guiding plate serves as the back-face member.
(9) The display according to any one of (1) to (8), further including
a top chassis and a middle chassis between the front-face member and the back-face member.
(10) The display according to any one of (1) to (9), wherein the front-face member and the back-face member are adhered to each other with an adhesion member.
(11) The display according to any one of (1) to (10), further including
a reinforcing frame provided on a display panel side of the back-face member.

The invention claimed is:

1. A display device comprising:
a housing including a front-face member, a metal frame and a rear plate, wherein glass is used as a material of the front-face member, wherein glass is used as a material of the rear plate;
a light-shielding film provided on the rear plate; and
an organic electroluminescence display panel arranged in the housing,
wherein the front-face member is provided on a front face of the organic electroluminescence display panel,
wherein the rear plate is provided opposite a back face of the organic electroluminescence display panel,
wherein the front-face member and the rear plate are arranged adjacent to the metal frame, and the metal frame has a protrusion section, the protrusion section having a first surface and a second surface arranged opposite each other and in which the first surface and second surface of the protrusion section respectively abut a first adhesive surface and a second adhesive surface within the housing.

2. The display device according to claim 1, wherein a spacer is provided between the rear plate and the organic electroluminescence display panel.

3. The display device according to claim 1, wherein a sealing layer is provided between the front-face member and the organic electroluminescence display panel.

4. The display device according to claim 1, wherein aluminum is used as a material of the metal plate.

5. The display device according to claim 1, wherein a thickness of the front-face member is between about 0.5 mm to 3.5 mm.

6. The display device according to claim 1, wherein a thickness of the rear plate is between about 1.0 mm to 3.0 mm.

7. The display device according to claim 1, wherein the protrusion section is elongated along a lengthwise direction of the organic electroluminescence display panel and positioned between the front-face member and the rear plate.

8. The display device according to claim 1, wherein the protrusion section extends into an adhesion section from a corner of the metal frame.

9. The display device according to claim 8, wherein the protrusion section comprises a third surface between the first and second surfaces.

10. The display device according to claim 1, wherein the first and second adhesive surfaces comprise an adhesion section.

11. A display device comprising:
a housing including a front-face member, a metal frame and a rear plate, wherein glass is used as a material of the front-face member, wherein glass is used as a material of the rear plate;
a light-shielding film provided on the rear plate; and
an organic electroluminescence display panel arranged in the housing,
wherein the front-face member is provided on a front face of the organic electroluminescence display panel,
wherein the rear plate is provided opposite a back face of the organic electroluminescence display panel,
wherein the metal frame is arranged between the front-face member and the rear plate, and the metal frame has a protrusion section, the protrusion section being elongated along a lengthwise direction of the organic electroluminescence display panel and positioned between the front-face member and the rear plate.

12. The display device according to claim 11, wherein a spacer is provided between the rear plate and the organic electroluminescence display panel.

13. The display device according to claim 11, wherein a sealing layer is provided between the front-face member and the organic electroluminescence display panel.

14. The display device according to claim 11, wherein the protrusion section extends into an adhesion section from a corner of the metal frame.

15. The display device according to claim 14, wherein the adhesion section comprises a first adhesive surface and a second adhesive surface, the first and second adhesive surfaces being arranged to abut respective first and second surfaces of the protrusion section along the lengthwise direction.

* * * * *